US012771296B2

(12) United States Patent
Maxim et al.

(10) Patent No.: US 12,771,296 B2
(45) Date of Patent: Oct. 20, 2026

(54) DOHERTY POWER AMPLIFIER SYSTEM

(71) Applicant: Qorvo US, Inc., Greensboro, NC (US)

(72) Inventors: George Maxim, Saratoga, CA (US); Nadim Khlat, Cugnaux (FR); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 710 days.

(21) Appl. No.: 18/313,018

(22) Filed: May 5, 2023

(65) Prior Publication Data

US 2023/0387861 A1 Nov. 30, 2023

Related U.S. Application Data

(60) Provisional application No. 63/411,792, filed on Sep. 30, 2022, provisional application No. 63/346,130, filed on May 26, 2022.

(51) Int. Cl.
*H03F 3/68* (2006.01)
*H03F 1/02* (2006.01)
(Continued)

(52) U.S. Cl.
CPC ......... *H03F 1/0288* (2013.01); *H03F 1/3247* (2013.01); *H03F 1/56* (2013.01);
(Continued)

(58) Field of Classification Search
CPC ........ H03F 1/0288; H03F 1/3247; H03F 1/56; H03F 3/195; H03F 3/245; H03F 2200/102; H03F 2200/105; H03F 2200/451; H03F 1/0222; H03F 1/0266; H03F 1/14; H03F 1/3223; H03F 1/3288; H03F 3/213; H03F 2200/318; H03F 2200/432; H03F 2200/468; H03F 2200/471; H03F 1/3241;
(Continued)

(56) References Cited

U.S. PATENT DOCUMENTS

| | | | | |
|---|---|---|---|---|
| 6,947,711 B1 | 9/2005 | Leyonhjelm | | |
| 7,619,468 B1 * | 11/2009 | Bowles | .................... | H03F 3/19 330/124 R |

(Continued)

FOREIGN PATENT DOCUMENTS

| | | |
|---|---|---|
| CN | 104052410 A | 9/2014 |

OTHER PUBLICATIONS

Author Unknown, "In-phase and quadrature components," Wikipedia, May 9, 2023, retrieved Apr. 3, 2024 from the Internet: [URL: https://en. wikiped ia. org/w/index. ph p?title= In-phase_ and_ quadrature_ components&oldid=1153995594], 3 pages.

(Continued)

*Primary Examiner* — Khanh V Nguyen

(74) *Attorney, Agent, or Firm* — Withrow & Terranova, P.L.L.C.

(57) ABSTRACT

A Doherty amplifier system is disclosed. The Doherty amplifier system includes a carrier amplifier having a carrier input and a carrier output, and a peaking amplifier having a peaking input coupled to the carrier input and a peaking output coupled to the carrier output. Analog pre-distortion circuitry is configured to linearize the carrier amplifier and linearize the peaking amplifier by compensating for base-to-collector capacitance loading of the carrier amplifier and the peaking amplifier during operation.

34 Claims, 9 Drawing Sheets

(51) Int. Cl.

| | |
|---|---|
| ***H03F 1/32*** | (2006.01) |
| ***H03F 1/56*** | (2006.01) |
| ***H03F 3/195*** | (2006.01) |
| ***H03F 3/24*** | (2006.01) |
| ***H04B 1/04*** | (2006.01) |

(52) U.S. Cl.
CPC ............. *H03F 3/195* (2013.01); *H03F 3/245* (2013.01); *H04B 1/0475* (2013.01); *H03F 2200/102* (2013.01); *H03F 2200/105* (2013.01); *H03F 2200/451* (2013.01); *H04B 2001/0425* (2013.01)

(58) Field of Classification Search
CPC .. H03F 2201/3227; H03F 3/602; H03F 3/211; H03F 3/68; H04B 1/0475; H04B 2001/0425
See application file for complete search history.

(56) References Cited

U.S. PATENT DOCUMENTS

| | | | |
|---|---|---|---|
| 8,497,736 B1 | 7/2013 | Leipold et al. | |
| 11,239,869 B2 | 2/2022 | Wang | |
| 2004/0174213 A1 | 9/2004 | Thompson | |
| 2007/0164818 A1* | 7/2007 | Horiguchi ............. | H03F 1/3276 330/124 R |
| 2019/0165736 A1 | 5/2019 | Khesbak et al. | |
| 2020/0014337 A1* | 1/2020 | Scott ....................... | H03F 3/193 |
| 2021/0126587 A1 | 4/2021 | Panseri et al. | |

OTHER PUBLICATIONS

Zhao, Y. et al., "Doherty Amplifier with DSP Control to Improve Performance in CDMA Operation," 2003 IEEE MTT-S International Microwave Symposium (IMS) Digest, vol. 2, Jun. 8-13, 2003, Philadelphia, PA, pp. 687-690.
Extended European Search Report for European Patent Application No. 23175748.5, mailed Mar. 18, 2024, 21 pages.
Ashish, K. et al., "Bandlimited DPD Adapted APD for 5G Communication," IEEE Transactions on Circuits and Systems—II: Express Briefs, vol. 70, No. 2, Feb. 2023, IEEE, pp. 496-500.
Partial European Search Report for European Patent Application No. 23175748.5, mailed Oct. 27, 2023, 18 pages.

* cited by examiner

DOHERTY POWER AMPLIFIER SYSTEM

RELATED APPLICATIONS

This application claims the benefit of provisional patent application Ser. No. 63/411,792, filed Sep. 30, 2022, and claims the benefit of provisional patent application Ser. No. 63/346,130, filed May 26, 2022, the disclosures of which are hereby incorporated herein by reference in their entireties.

FIELD OF THE DISCLOSURE

The present disclosure relates to amplifiers and in particular to improving the linearity of Doherty-type amplifiers.

BACKGROUND

Digital pre-distortion (DPD) control of power amplifiers used in prime-tier phones offers good linearity performance at a trade-off of increased complexity and a more complicated system calibration. DPD control of power amplifiers is becoming a more prevalent method of power amplifier linearization, while offering a lower collector supply current, comparable in many cases with envelope tracking system current. A drawback of DPD control of power amplifiers is the need for large tables of DPD coefficients needed to address dynamic changes in power amplifier operating conditions during DPD linearization. Both memory-less and with-memory DPD linearization have been developed. The memory-less DPD linearization uses polynomials of different orders to provide pre-distortion that cancels the intrinsic power amplifier distortion.

Typically, a baseband processor controls both the DPD linearization and the power management integrated circuit. As such, the baseband processor has access to a present value of the average power tracking supply voltage, by which the baseband processor can adjust coefficients of a polynomial DPD to adapt to the different behavior of the power amplifier at different supply voltages.

Furthermore, the baseband processor has access to which communication channel is presently in operation and can change DPD coefficients as a function of the operation channel frequency. An excessive amount of memory is needed to store the DPD linearization coefficients for a large matrix of operating conditions that include but are not limited to supply voltage, channel frequency, and collector current. For Doherty power amplifiers, capturing the supply and voltage standing wave ratio dependencies and using DPD coefficient sets to adapt to such dynamic operating conditions result in a need for a relatively very complicated calibration system. As such, a need remains for Doherty power amplifiers that are structured such that complicated calibration systems are not required.

SUMMARY

A Doherty amplifier system is disclosed. The Doherty amplifier system includes a carrier amplifier having a carrier input and a carrier output, and a peaking amplifier having a peaking input coupled to the carrier input and a peaking output coupled to the carrier output. Analog pre-distortion circuitry is configured to linearize the carrier amplifier and linearize the peaking amplifier by compensating for base-to-collector capacitance loading of the carrier amplifier and the peaking amplifier during operation.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure and, together with the description, serve to explain the principles of the disclosure.

DETAILED DESCRIPTION

Figure 1:
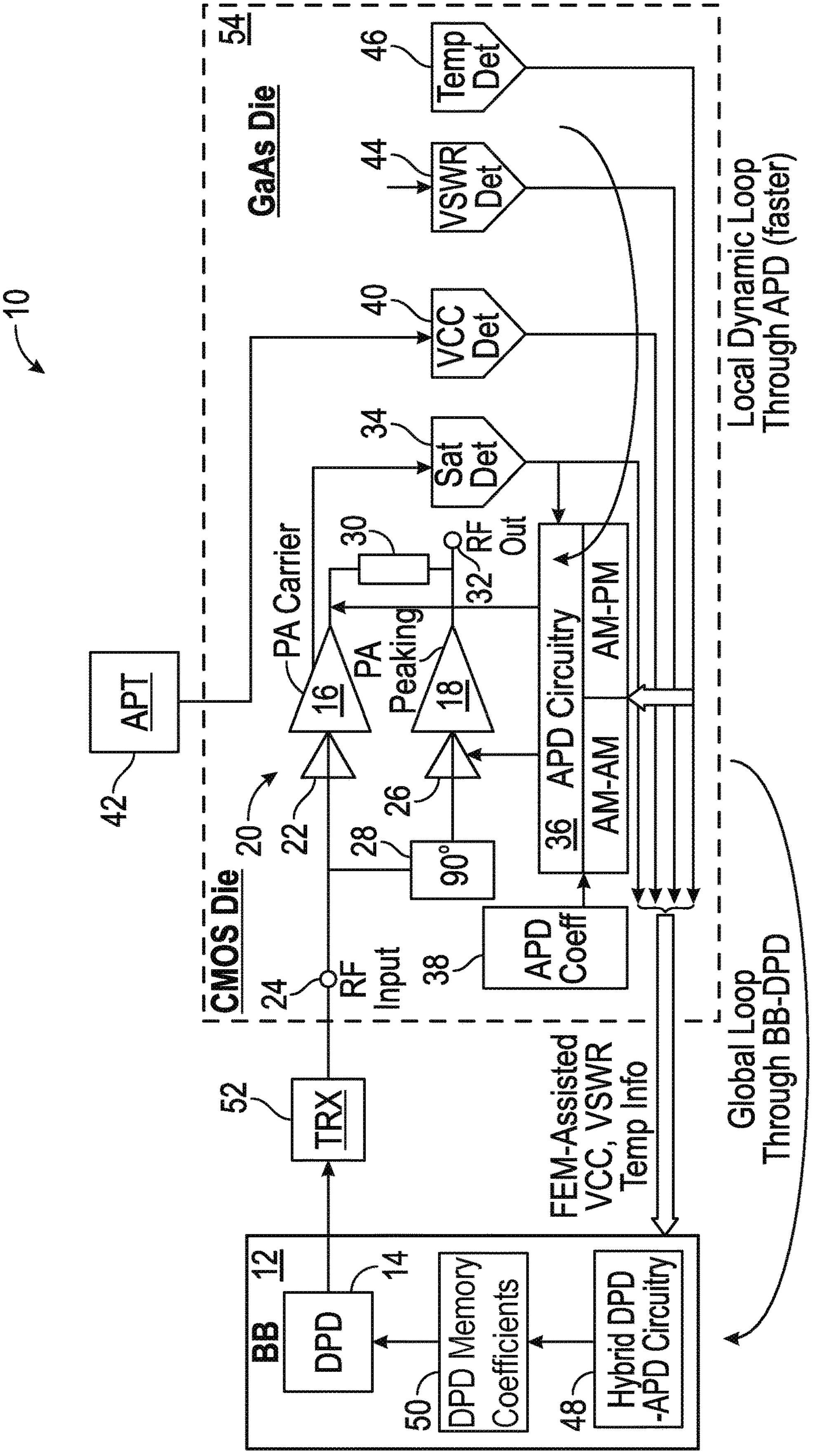
FIG. 1 is a schematic of a first exemplary embodiment of a Doherty power amplifier system that is structured to employ digital pre-distortion (DPD) and analog pre-distortion (APD) to provide linearization of a carrier amplifier and a peaking amplifier that make up a hybrid Doherty amplifier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Doherty power amplifiers are notorious for their large distortion created at the activation of the peaking power amplifier. Digital pre-distortion (DPD)—only linearization schemes are used for linearizing Doherty power amplifiers. However, such schemes are blind to any dynamic conditions under which the power amplifier may operate. These dynamic conditions, such as local power amplifier temperature, local power amplifier supply voltage, and load voltage standing wave ratio, can have a very large impact on the power amplifier distortion characteristics and are hard to correct with DPD (and may require large memory tables). Furthermore, the nonlinearity coming from the base-to-collector capacitance (Cbc) loading are hard to compensate at the baseband level. It is much easier to correct such nonlinear effects directly in the front-end using analog techniques.

The present disclosure relates to a hybrid gallium arsenide (GaAs)— complementary metal oxide semiconductor (CMOS) Doherty power amplifier using analog pre-distortion (APD) or digital and analog pre-distortion (DPD-APD) linearization. The APD linearization deals mainly with the Cbc nonlinear loading effects, which are easy to adjust and calibrate if the front-end drivers are implemented in a CMOS die. The GaAs output stage die may have temperature sensors, supply voltage sensors, load sensors, process corner sensors, and such and can send the detected signals to the CMOS front-end to take action to correct any such dynamic variation. The activation of the peaking amplifier can be done in two ways: using a carrier power amplifier saturation detector with threshold and gain adjustments or using an envelope activation signal from the baseband (analog or digital activation signal). The driver stage, the inter-stage matching network with phase shift capabilities, and any cross-feedforward amplifiers for Cbc effect neutralization can be digitally controlled and calibrated. The hybrid analog and digital pre-distortion can have the APD as the main linearization or the DPD as main linearization. These techniques can be applied both to average power tracking power management integrated circuit (PMIC)-based Doherty power amplifiers and envelope tracking PMIC-based Doherty power amplifiers. The analog envelope signal can use a linear or non-linear envelope dependence and have additional shape-conditioning blocs. The analog envelope signal can be used to drive dynamic APD phase shifting and/or dynamic APD gain peaking stages that linearize the Doherty power amplifier.

Doherty power amplifiers operated from an APT PMIC supply can be an attractive alternative to a standard power amplifier operated with an ET PMIC that needs a very complicated calibration and control scheme.

For high-efficiency Doherty power amplifiers, the key is the way in which the peaking power amplifier is activated and the correction of the distortion created by the activation of the peaking power amplifier that brings the added efficiency via the load modulation. In general, embodiments of the present disclosure provide:

- envelope tracking dynamic phase shift
- dedicated baseband dynamic phase shift
- internal dynamic phase shift controlled by a signal generated in the Doherty power amplifier, for example, by sensing the saturation of the carrier power amplifier (when the peaking power amplifier needs to be activated).

The present disclosure includes Doherty power amplifiers having single-ended carrier and peaking power amplifiers, differential carrier and peaking-power amplifiers, or a combination of single-ended and differential stages. In multi-stage Doherty power amplifiers, driver stages and the output stages may be single-ended or differential, or multi-stage Doherty power amplifiers may have a single-ended driver and a differential output stage or vice versa.

As depicted in FIG. 1, the present disclosure relates to a Doherty power amplifier system 10 that eliminates the need for complicated calibration systems for Doherty power amplifiers. In general, the disclosed Doherty power amplifier system 10 employs amplifier linearization using analog techniques that include APD and DPD in hybrid DPD-APD and APD-DPD structures. The disclosed Doherty power amplifier system 10 and associated method substantially reduce the size of the memory needed to store the DPD coefficients while also substantially reducing complexity of Doherty power amplifier calibration processes.

In many cases, a baseband processor 12 having DPD circuitry 14 deployed in a baseband chipset needs to operate with various power amplifiers, often coming from different vendors and having different characteristics. The baseband processor 12 needs access to a thorough characterization of each power amplifier that is used and the calibration of the DPD coefficients for each mode of operation.

The present Doherty power amplifier system 10 is structured to employ DPD and APD to provide linearization of a carrier amplifier 16 and a peaking amplifier 18 that make up a hybrid Doherty amplifier 20. A carrier driver stage 22 is coupled between an RF input terminal 24 and the carrier amplifier 16. A peaking driver input stage 26 is coupled between the peaking amplifier 18 and the RF input terminal 24 though a 90° coupler/splitter 28. An impedance inverter is coupled between outputs of the carrier amplifier 16 and the peaking amplifier 18 and an RF output terminal 32. The hybrid Doherty power amplifier employs one or more methods to activate the peaking amplifier 18. A first method employed by the Doherty power amplifier system 10 uses a cross-feedforward control that senses with a saturation detector 34 when the carrier power amplifier 16 starts to compress and in response generates a compression detection signal. APD circuitry 36 receives the compression detection signal and in response activates the peaking amplifier 18 by way of the peaking driver input stage 26 to flatten a gain curve of the peaking amplifier 18. An APD coefficients memory block 38 stores APD coefficients that the APD circuitry 36 is configured to use to adjust the activation signal. The APD circuitry provides both amplitude modulation-amplitude modulation (AM-AM) linearization and amplitude modulation-phase modulation (AM-PM) linearization.

A supply voltage (VCC) detector 40 coupled to average power tracking (APT) circuitry 42 is configured to generate a supply detector signal that is received by the APD circuitry 36 that in response further adjusts the activation signal. Additional detectors include but are not limited to a voltage standing wave (VSWR) detector 44 and a temperature detector 46. The VSWR detector 44 generates a VSWR signal that represents the state of the VSWR of an amplified RF signal that is output from the RF output terminal 32. The temperature detector 46 generates a temperature signal that is proportional to the operating temperature of the hybrid Doherty amplifier 20.

A hybrid DPD-APD circuitry 48 within the baseband processor 12 is configured to receive the compression detection signal, the supply detector signal, the VSWR signal, and the temperature signal and to generate a coefficient signal that selects appropriate DPD coefficients and activation points from a DPD coefficients memory 50. The DPD coefficients memory 50 is configured in turn to pass the DPD coefficients to the DPD circuitry 14. Based on the DPD coefficients, the DPD circuitry 14 drives a transmitter (TRX) circuitry 52 to pre-distort an RF signal that is input into the RF input terminal 24. In the exemplary embodiment of FIG. 1, components that include the hybrid Doherty amplifier 20, the APD circuitry 36, the APD coefficients memory block 38, the saturation detector 34, the VCC detector 40, the VSWR detector 40, and the temperature detector 46 make up a front-end module 54. Some of the components may be integrated into a CMOS die, and other components may be integrated into a GaAs die. For example, the hybrid Doherty amplifier 20 may be integrated into a GaAs die and the APD linearization may be driven by a dedicated CMOS transmit (TX) controller, or may be integrated into a hybrid GaAs-CMOS version of the hybrid Doherty amplifier 20 having APD implemented in a CMOS die, respectively.

Another method employed by the hybrid Doherty amplifier 20 uses a direct baseband feedforward activation that is based on a pre-qualification of the hybrid Doherty amplifier 20 that saves activation points in the DPD coefficients memory 50 of the baseband processor 12. The stored activation points are used by the baseband processor 12 to determine when the peaking amplifier 18 needs to be activated for various environmental operating conditions that may include but are not limited to VCC, operating temperature, and load VSWR.

In some instances, the activation signal is a linear analog signal for peaking power amplifier activation. A lower slope for the activation signal leads to slower activation of the peaking amplifier 18, while a higher slope results in faster activation of the peaking amplifier 18. In other instances, the activation signal is a non-linear analog signal for accelerated peaking power amplifier activation.

The activation of the peaking amplifier 18 can be achieved directly from an envelope signal provided by the baseband processor 12 or from an internal current-generated activation signal such as the saturation detection signal generated by the saturation detector 34. Additional shape processing can be used to optimize the peaking power amplifier activation. A pre-distortion of the envelope signal can be used. A non-linear activation that is a function of an envelope characteristic results in an accelerated activation of the peaking amplifier 18.

In some embodiments, the hybrid Doherty power amplifier 20 having a complementary metal oxide semiconductor (CMOS) front-end allows mixed signal techniques to control, adjust, or calibrate the activation of the peaking amplifier 18. Moreover, activation of the peaking amplifier 18 may be aligned using both APD threshold adjustment and APD slope adjustment, respectively. Further still, slope adjustments and threshold adjustments can be driven by a calibration circuit for Doherty power amplifier APD linearization.

Employing the saturation detector 34 for the carrier amplifier 16 to activate the peaking amplifier 18 does not always offer enough flexibility in tuning the Doherty power amplifier linearity performance. Any process variation and local mismatch, difference in local temperatures, and other environmental operating conditions may misalign the linearization with the power amplifier intrinsic distortion. Compensating for such effects may require an additional level of control on the activation of the peaking amplifier 18.

Two components of the activation signal for the peaking amplifier 18 are employable by the Doherty power amplifier system 10. A first component is the threshold adjustment that can move up and down the envelope signal value when the peaking amplifier 18 is activated. A second component is the slope of the peaking power amplifier activation, how fast it becomes active, and how much load modulation it provides. This is the slope adjustment of the peaking power amplifier activation signal.

Having digital adjustment on both the threshold and slope of the activation signal of the peaking amplifier 18 helps improve the alignment of the APD correction with the native distortion of the carrier power amplifier 16. In this way any offset in the saturation detector 34 can be compensated, resulting in a higher linearity of the overall APD-correction for the hybrid Doherty amplifier 20.

The hybrid Doherty amplifier 20 sees the input load of different acoustic filters (not shown), depending on the current band of operation. This creates different compression characteristics for the multitude of operating bands. Having a digitally controlled APD scheme allows saving locally different APD coefficients for each band of operation and deploying such settings as a function of the given filter path that is selected.

For very wide wireless bands such as the ultra high band (UHB) B78, B79 bands, the loading on the hybrid Doherty amplifier 20 may also vary significantly inside a given band. The digital adjustable analog APD linearization provided by the Doherty power amplifier system 10 can also use different APD coefficients for different segments of a wireless band of operation. This gives a sub-banding of the APD linearization of the hybrid Doherty amplifier 20. The baseband can communicate to the front-end the precise sub-band of operation for which to select the APD coefficients.

With the APD linearization of a Doherty power amplifier and the hybrid analog and digital pre-distortion (APD-DPD) linearization of the hybrid Doherty amplifier 20, respectively, because one of the pre-distortion methods may be primary and one may be secondary, it is possible to have a hybrid APD-DPD embodiment or a hybrid DPD-APD embodiment.

The disclosed Doherty power amplifier linearization methods may include the following two methods. A first method is a stand-alone APD linearization where all controls of the APD are generated internally in the front-end module 54. An optional baseband assist control signal can be provided, such as the frequency band and sub-band of operation. A second method is a hybrid analog and DPD linearization where a front-end APD works together with the baseband DPD.

When a hybrid DPD and APD Doherty power amplifier linearization is implemented, one of the two linearization methods may be the primary, while the other one can be the secondary, or auxiliary, linearization scheme.

In general, the DPD linearization is relatively better in terms of compensating for memory effects and in implementing higher-order linearization schemes. Therefore, in many cases it is advantageous to leave the baseband DPD to be the main linearization scheme, while the APD linearization acts more as a support/auxiliary linearization that deals with dynamic local variability such as the local temperature impact, the load-VSWR impact, and the local dynamic supply variation impact. As such, the front-end module 54 may include several local analog detectors that can sense the power amplifier real-time temperature, the dynamic variation of the VCC, the dynamic load VSWR variation, and so on. The local analog detectors of the exemplary embodiment of FIG. 1 are the saturation detector 34, the VCC detector 40, the VSWR detector 44, and the temperature detector 46, and these make up the front-end module 54.

Reducing the range of variation for the nonlinear power amplifier characteristics can result in a simple calibration procedure and a smaller memory size needed by the DPD circuitry 14, due to fewer coefficient sets needed to cover the entire operation space, since many of the local dynamic variations are compensated locally by the APD loop.

Several ways in which the Doherty power amplifier system 10 can be partitioned include, but are not limited to, the following:

1. A traditional all-GaAs power amplifier solution will have the carrier driver stage 22, the carrier amplifier 16, the peaking driver input stage 26, and the peaking amplifier 18 integrated on a GaAs die, while a typical TX controller (not shown) is usually implemented using a CMOS die. A main drawback with this traditional all-GaAs power amplifier solution is the lack of direct contact to radio frequency (RF) nodes from the CMOS side with a main interface between the GaAs die and the CMOS die being direct current bias signals.
2. An improved partition in accordance with the present disclosure is to use a hybrid GaAs-CMOS implementation in which only the carrier amplifier 16 and peaking amplifier 18 are integrated into a GaAs die, while the carrier driver stage 22, the peaking driver input stage 26, and the APD circuitry 36 are integrated into a CMOS die. The improved partition offers advantages in terms of digital control and tunability of the power amplifier front-end (both gain and phase tuning) and access from the CMOS side to RF nodes within the hybrid Doherty amplifier 20.

Figure 2:
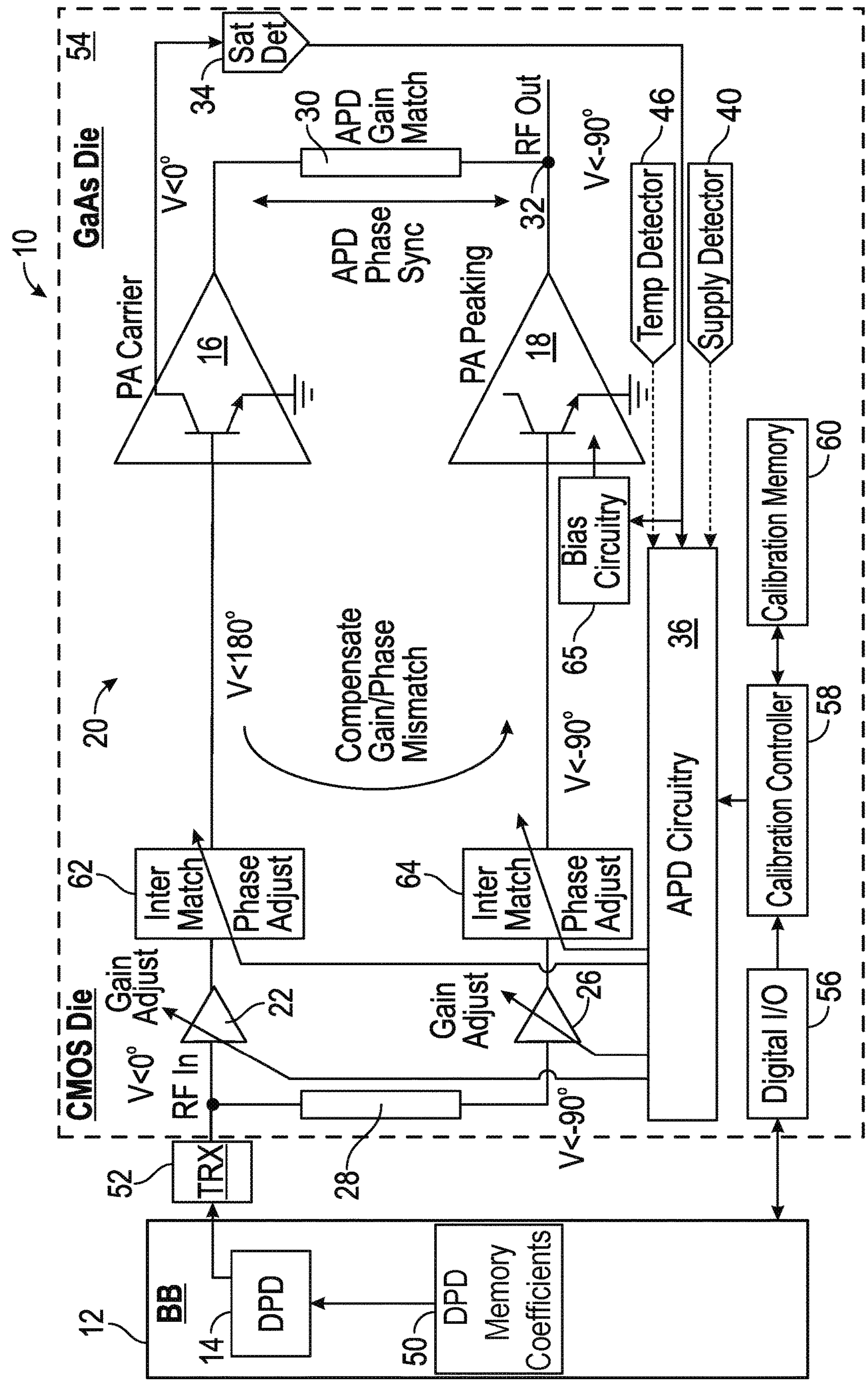
FIG. 2 is a schematic of a second exemplary embodiment of the Doherty amplifier that includes digital input/output circuitry that is configured to interface a baseband processor with a calibration controller that is configured to control calibration of the APD circuitry.

As depicted in FIG. 2, digital input/output (I/O) circuitry 56 is configured to interface the baseband processor 12 with a calibration controller 58 that is configured to control calibration of the APD circuitry 36. A calibration memory 60 is configured to store calibration data for the APD circuitry 36. The calibration memory 60 is configured to communicate with the calibration controller 58. It is relatively easier to integrate the APD circuitry 36 with the digital I/O circuitry 56, the calibration controller 58, and the calibration memory 60 in CMOS than in GaAs. In contrast, in some embodiments such as the exemplary embodiment of FIG. 2, the saturation detector 34, the supply detector 40, and the temperature detector 46 are integrated in GaAs.

The digital I/O circuitry 56 provides an interface to the baseband DPD linearization scheme. Any of the detector signals can be communicated to the baseband processor 12 and processed by the DPD circuitry 14 to enhance the digital DPD linearization scheme. For example, the DPD coefficients stored in the DPD coefficients memory 50 may be changed when large changes in power amplifier real-time temperature are sensed. Similarly, the DPD coefficients may be changed when the load VSWR has changed significantly.

In the exemplary embodiment depicted in FIG. 2, phase adjustment in the carrier path is realized with carrier interstage impedance matching circuitry 62 that is configured to adjust the phase of a first portion of a carrier signal in response to a first phase adjustment signal generated by the APD circuitry 36. Similarly, phase adjustment in the peaking path is realized with peaking interstage impedance matching circuitry 64 that is configured to adjust the phase of a second portion of the carrier signal in response to a second phase adjustment signal generated by the APD circuitry 36. The first phase adjustment signal and the second phase adjustment signal may be generated by the APD circuitry 36 in response to any or all the detector signals generated by analog detectors such as the saturation detector 34, the VCC detector 40, and the temperature detector 46. The analog detectors may be linear sensors or non-linear sensors depending on a given application.

The activation of the peaking amplifier 18 may be triggered by the saturation detector 34 in various ways. In one operation mode, only the bias of the peaking amplifier 18 is boosted by an activation signal generated by the saturation detector 34, while the peaking driver input stage 26 remains active. In this case the activation signal drives bias circuitry 65. In another operation mode, the peaking driver input stage 26 driving the peaking amplifier 18 is configured for a variable gain amplifier (VGA) control based on the activation signal generated by the saturation detector 34 and processed by the APD circuitry 36. In a third operation mode, both the bias and the variable gain of the peaking driver input stage 26 is controlled by the activation signal generated by the saturation detector 34.

One of the major distortion effects in the Doherty amplifier system comes from parasitic current due to the base-to-collector capacitance (Cbc) of the peaking amplifier 18 when it turns on. To compensate for the Cbc loading of the peaking power amplifier output stage, the current of the Cbc needs to be supplied by a path different from the peaking path. This can be realized by adding a feedforward amplifier tapped from the carrier amplifier input. The issue is that there are time delays in the inter-stage matching networks and in the active stages. Such delays may shift the compensation current and time, and make it to appear at the wrong time, creating distortion.

Figure 3:
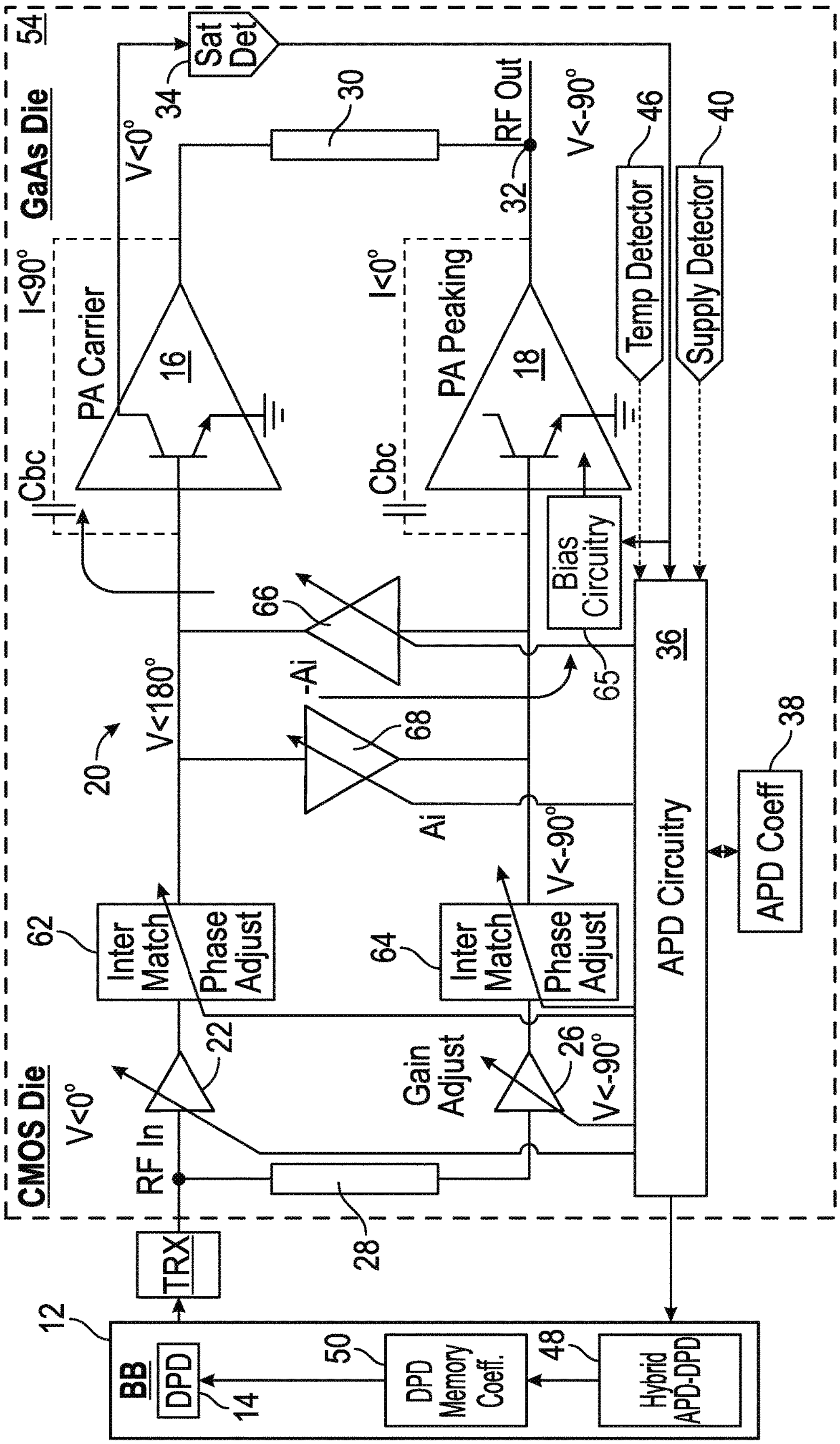
FIG. 3 is a schematic of a third exemplary embodiment of the Doherty amplifier wherein APD circuitry provides both AM-AM linearization and AM-PM linearization that has relatively substantially higher control bandwidth than signal modulation bandwidth.

A better solution is to tap the control for a cross-feedforward amplifier 66 that drives Cbc of the carrier amplifier 16 directly from the base of the peaking amplifier 18, as shown in FIG. 3. This avoids the time delays and results in a self-aligned correction. A neutralization current injected into Cbc of the carrier amplifier 16 neutralizes the Cbc loading of the carrier amplifier 16. In a similar way, the loading from Cbc of the peaking amplifier 18 can be neutralized by using a cross-feedforward amplifier 68 driven by the portion of the carrier signal at the base of the carrier amplifier 16, as shown in FIG. 3.

Although the two cross-feedforward neutralization amplifiers appear to be connected in a positive feedback loop, this is not the case because the signals involved are not present all the times and do not have the phase relation to result in a positive feedback instability.

As depicted in FIG. 3, a local dynamic loop through the APD circuitry 36 provides faster control of the hybrid Doherty amplifier 20. In this regard, the APD circuitry 36 providing both AM-AM linearization and AM-PM linearization has relatively substantially higher control bandwidth than signal modulation bandwidth. For the relevant sections of the APD circuitry 36 providing AM-AM linearization, the control bandwidth needs to be 2 to 3 times the modulation bandwidth, while for the AM-PM linearization, relevant sections of the APD circuitry 36 have a control bandwidth of 5 to 6 times the modulation bandwidth. When the modulation bandwidth is 20 MHz or 40 MHz, desirable current consumption and relatively lower circuit complexity is realizable. As the modulation bandwidths goes to 100 MHz and beyond, it is relatively more difficult to achieve control bandwidths of 500 MHz. For example, the AM-AM gain boosting is limited by the relatively large ballast resistance required for the thermal stability of the power amplifier. Wide bandwidth in the hundreds of megahertz in the bias circuitry 65 can be realized if the ballast resistance is reduced.

In this regard, embodiments of the present disclosure use a feedback ballast architecture in which most of the ballast resistor is placed inside the feedback loop of the bias circuitry 65, and only a small ballast resistor is implemented outside the loop. The inside the loop ballast resistance is divided by the loop gain of the bias circuitry 65 and thus appears much smaller when contributing to the major control pole at the input of the power amplifier output stage. The inside the loop ballast resistance offers sufficient differential thermal stability between the different power cells of the power amplifier. The out-of-loop ballast resistance is to help with the global common-mode thermal stability of the power amplifier. Moreover, the saturation detector 34 as shown in FIG. 3 has only a single device in a feedback path and thus achieves a very large bandwidth, having only a small delay time.

In real-life circuits there is a finite mismatch between the carrier path and peaking path gain and phase. This can come from the device mismatches and from radically different local temperature levels between the relatively hotter carrier amplifier 16 that operates at large power level and the relatively cooler peaking amplifier 18 right at the point the peaking amplifier 18 turns on. Having a hybrid GaAs-CMOS Doherty power amplifier configuration allows for easy adjustment and calibration of the gain and phase between the carrier and the peaking paths.

Figure 4:
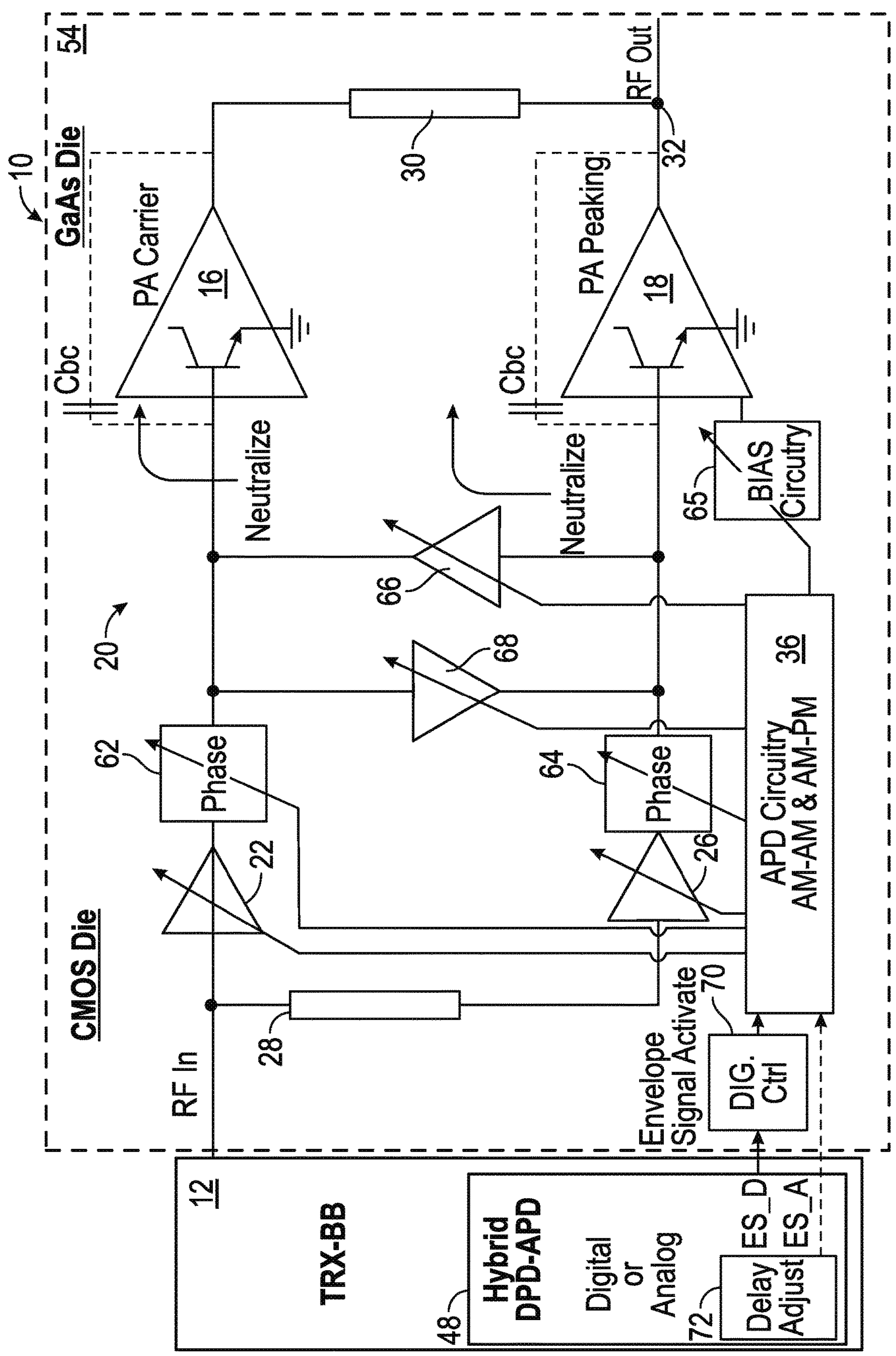
FIG. 4 is a schematic of an exemplary embodiment of a hybrid gallium arsenide-complementary metal oxide semiconductor (GaAs-CMOS) version of the Doherty amplifier system where the CMOS portion of the front-end incorporates individual path gain and phase adjustment with optional digital register control and calibration.

FIG. 4 shows an exemplary embodiment of a hybrid GaAs-CMOS version of the Doherty amplifier system 10 where the CMOS portion of the front-end incorporates individual path gain and phase adjustment with optional digital register control and calibration.

A digital controller/driver 70 can easily implement specific registers for calibrating the gain and phase matching by way of the APD circuitry 36. A local memory in the front-end module TX controller (not shown) can be used to save the APD coefficients for various conditions of operation:

Different frequency bands or sub-bands
Different VCC levels
Different temperature levels All these linearization and calibration circuits are positioned in front of the carrier and peaking power amplifier output stage and thus can be easily implemented in the CMOS die. Being done in CMOS allows for their digital gain control using dedicated register settings in the digital I/O bloc. A local memory bloc may be used to save all such APD coefficients for both the carrier and the peaking path. The input and output phase shifting circuits (lumped or transmission line) may be implemented in the laminate or may be integrated on the die. The input phase splitting circuit on the CMOS side can also have digital trimming/ adjustment circuits. The signal levels at the driver level are not that high, allowing the CMOS implementation without any particular drawback.

Considering all this calibration and APD circuitry, the high efficiency Doherty power amplifier is not significantly simpler than a high efficiency ET power amplifier. The advantage, though, is that the complexity can be contained inside the front-end module, without exposing it to the customer. Many original equipment manufacturers avoid the use of ET PMIC solutions, particularly due to their notorious complexity and difficulty of calibration and control.

The APD AM-PM linearization can largely compensate with the strong phase distortion that happens when the peaking amplifier is activated. This was one of the major show-stoppers in deploying the Doherty configuration in cellular applications that require a very high linearity (e.g., 5G front-ends).

As stated at the beginning of this disclosure, the other way to activate the peaking amplifier is using an auxiliary control signal from the baseband. The baseband knows when the envelope grows and thus the power amplifier would likely start compressing. This is when the peaking amplifier needs to be activated. Both analog or digital envelope activation signals can be used for the peaking power amplifier.

The analog pre-distortion can be used to create the required profile for the peaking power amplifier control signal starting from either an analog or a digital envelope activation signal. An analog envelope activation signal is easier to use due to its continuous nature. However, running an additional analog signal from the baseband to the front-end is not always possible or desired. It certainly requires a significant change in the baseband architecture. Therefore, not all basebands may support such architecture. Any customization in the direction of an analog envelope signal may restrict the front-end modules with which the signal can work.

In contrast, a digital envelope activation signal is easier to use, but a traditional digital I/O circuit may not have enough high clock frequency in order to provide a well-aligned envelope digital control. Particularly in the very wide modulation bandwidth (e.g., 100 MHz or 200 MHz), the regular radio frequency front-end interface cannot be used.

A dedicated high-speed digital signal can be used to activate the peaking amplifier. This is more desirable in comparison with an analog envelope signal that is more prone to noise coupling. If a digital activation of the peaking amplifier is used, a digital-and-analog pre-distortion scheme results. All the signal processing of the envelope activation signal can be performed in the analog front-end. Alternatively, some signal processing, such as the time delay of the digital activation signal, may be done in the baseband chip.

An envelope signal activation control may come directly from the baseband processor 12, in which a hybrid DPD-APD linearization scheme can be implemented having the digital components as the master linearization scheme.

In this direct baseband peaking power amplifier activation, one of the three configurations can be used:

1. Having the driver of the peaking amplifier active all the time and kicking/enabling the output peaking stage from the activation signal provided by the baseband;
2. Having both the driver stage and the output stage of the peaking amplifier activated by the envelope signal from the baseband; and
3. Using a variable gain amplifier/programmable-gain amplifier gain control on the driver stage and letting the output stage rectify itself at high power to get active is the less desired solution, but is still possible.

Just using an analog or digital activation of the peaking amplifier is not sufficient to get a high linearity Doherty power amplifier for cellular applications. Additional linearization techniques need to be deployed in order to compensate the distortion generated by the peaking amplifier activation.

Furthermore, in this baseband activated peaking amplifier scheme the driver and the inter-stage blocs are implemented in the CMOS die and thus can have gain and phase adjustment and calibration features. In this case the APD is used to create the required control signal from the envelope activation signal provided by the baseband (analog or most likely digital). The CMOS front-end also allows for implementing temperature, supply, or even load dependent adjustments that are hard to implement in GaAs.

The baseband can provide a dedicated activation signal for the peaking-power amplifier. Both a digital or an analog activation signal can be used. In the case of an ET PMIC, the baseband processor already provides an analog envelope tracking signal to the PMIC power management chip/module. This analog envelope-dependent signal can be used to activate the peaking-power amplifier path.

In Doherty power amplifiers it is usually the phase distortion that dominates the error vector magnitude. The phase distortion of the Doherty power amplifier is highly correlated with the activation of the peaking power amplifier. Therefore, the same analog envelope signal can be used to perform AM-PM phase linearization using dynamic phase shifting provided by either or both of the carrier interstage impedance matching circuitry 62 and the peaking interstage impedance matching circuitry 64 that are configured for dynamic phase shifting.

In the embodiment depicted in FIG. 4, the baseband processor 12 is configured to provide a separate analog envelope signal (ES_A) and/or an envelope-derived/dependent signal (ES_D). Further signal shaping (pre-distortion) can be used in order to achieve the desired dynamic linearization control signal. In more other implementations, general dynamic phase shifters and/or variable gain amplifiers can be controlled by the activation signal.

The cross-feedforward method does not have stability issues, but a delay on the analog activation path is relatively important to ensure that the peaking activation is aligned with compression of the carrier amplifier 16. The cross-feedforward method is particularly well suited for modulation bandwidths of less than 100 MHz.

For a signal having a modulation bandwidth more than 100 MHz, it may be more difficult to achieve a small enough delay in an APD feedforward path to keep good linearity. In such cases, a digital adjustable time delay circuitry 72 may be used with a direct digital activation that is synchronized with the modulation envelope of the signal.

Figure 5:
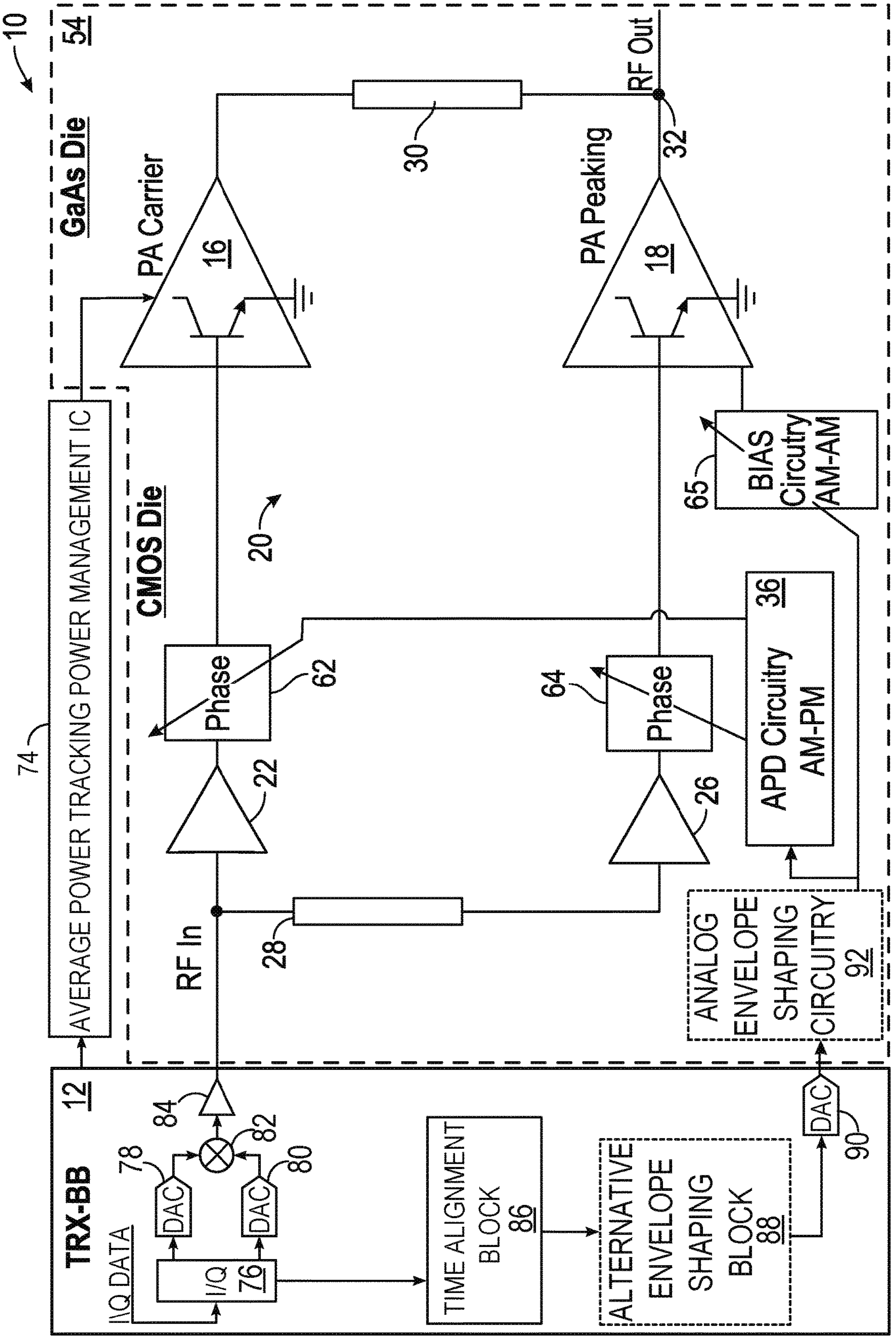
FIG. 5 is a schematic of an embodiment of the Doherty power amplifier system showing the principle of baseband activation of the Doherty power amplifier APD linearization using a dedicated envelope-based activation path that includes time alignment.

FIG. 5 is a schematic of an embodiment of the Doherty power amplifier system 10 showing the principle of baseband activation of the Doherty power amplifier APD linearization using a dedicated envelope-based activation path that includes time alignment, envelope signal shaping (either on the baseband or front-end side) and controls for the AM-AM and AM-PM APD linearization.

As depicted in FIG. 5, the baseband processor 12 includes an in-phase signal and quadrature signal (I/O) modulator 76 configured to generate a digital in-phase signal and a digital quadrature signal from I/O data. An in-phase digital-to-analog converter 78 is configured to convert the digital in-phase signal to an analog in-phase signal, and a quadrature digital-to-analog converter 80 is configured to convert the digital quadrature signal to an analog quadrature signal.

A mixer 82 is configured to receive and mix the analog in-phase signal and the analog quadrature signal to generate an RF signal that is pre-amplified by a preamplifier 84 that is configured to output a pre-amplified RF signal to the RF input (RF In) of the hybrid Doherty amplifier 20.

Time alignment between the dedicated envelope-based activation path that includes the peaking amplifier and the RF signal being amplified is provided by a time alignment block 86 that is configured to delay or advance a reference signal output by the I/O modulator in response to the I/O data. The time alignment block 86 may be fabricated in digital circuitry such as logic gates or may be implemented by firmware or software processor instructions.

An alternative envelope shaping block 88 is configured to digitally generate and shape an envelope of a digital distortion compensation signal that controls the APD circuitry 36 and the bias circuitry 65. A compensation signal digital-to-analog converter 90 is configured to convert the digital distortion compensation signal into an analog compensation signal. Analog envelope shaping circuitry 92 is configured to shape the analog compensation signal in place of the alternative envelope shaping block 88 in applications in which digital processing is not practical due to bandwidth constraints. In some embodiments, the alternative envelope shaping block 88 and the analog envelope shaping circuitry may work together to shape the compensation signal in some embodiment. The analog envelope shaping circuitry 92 may be fabricated from typical circuit elements such as diodes and/or transistors along with passive elements such as resistors, inductors, and capacitors.

The baseband can provide a dedicated activation signal for the Doherty power amplifier APD linearization. Both a digital and an analog activation signal can be used. Baseband chipsets for APT application do not normally have an envelope-type output.

In the case of baseband chipset for envelope tracking applications, the baseband processor 12 provides an analog envelope tracking signal to an average power tracking power management integrated circuit 74. This analog envelope dependent signal can be re-used to activate the peaking-power amplifier path.

In Doherty power amplifiers it is usually the phase distortion that dominates error vector magnitude. The phase distortion of the hybrid Doherty amplifier 20 is highly correlated with the activation of the peaking power amplifier 18. Therefore, the same analog envelope signal can be used to perform AM-PM phase linearization using a dynamic phase shifter.

The embodiment of FIG. 5 provides:

Envelope tracking dynamic phase shift

Dedicated baseband dynamic phase shift

Internal dynamic phase shift controlled by a signal generated in the Doherty power amplifier, for example, by sensing the saturation of the carrier power amplifier (when the peaking power amplifier needs to be activated).

Figure 6:
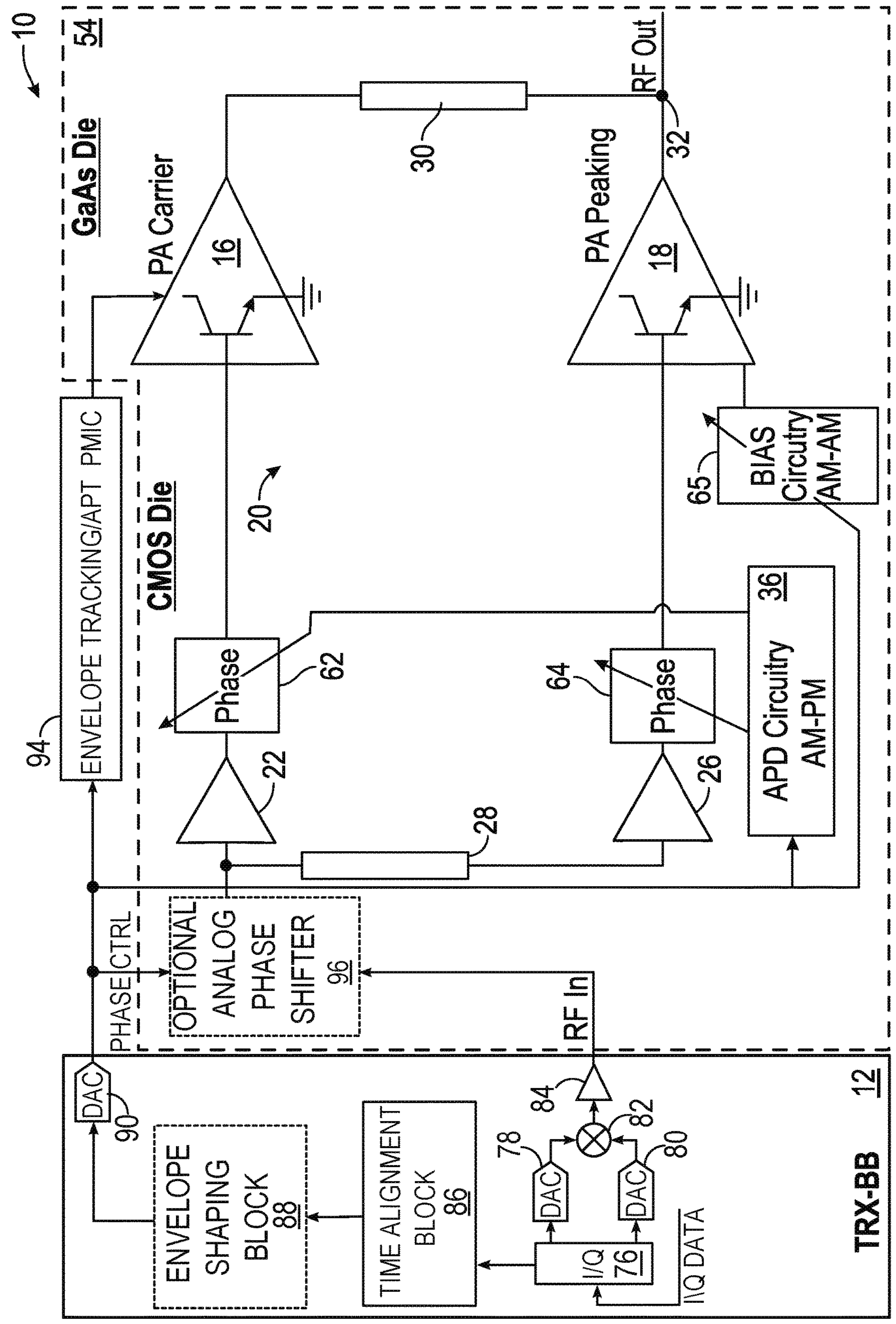
FIG. 6 is a schematic of an embodiment of the Doherty power amplifier system illustrating the principle of baseband activation of the Doherty power amplifier APD linearization using a dedicated envelope-based activation path that includes time alignment.

FIG. 6 is a schematic of an embodiment Doherty power amplifier system 10 illustrating the principle of baseband activation of the Doherty power amplifier APD linearization using a dedicated envelope-based activation path that includes time alignment, envelope signal shaping (either on the baseband or front-end side) and controls for the AM-AM and AM-PM APD linearization.

The baseband processor 12 may provide a dedicated activation signal for the Doherty power amplifier APD linearization. Both a digital or an analog activation signal can be used. Baseband chipsets for APT application do not normally have an envelope-type output.

In the case of baseband chipset for ET applications, the baseband processor 12 already provides an analog ET signal to a PMIC power management chip/module, which is depicted as an ET/APT PMIC 94. This analog envelope-dependent signal can be re-used to activate the peaking-power amplifier path.

In Doherty power amplifiers it is usually the phase distortion that dominates the error vector magnitude. The phase distortion of the Doherty power amplifier is highly correlated with the activation of the peaking power amplifier. Therefore, the same analog envelope signal can be used to perform AM-PM phase linearization using a dynamic phase shifter.

A common dynamic phase shifter 96 can be placed at the RF In input of the Doherty power amplifier (as shown dotted line as the optional analog phase shifter). The dynamic phase shifter 96 is responsive to a phase control (CTRL) signal that is derived from the envelope signal output from the compensation signal digital-to-analog converter 90. Another option is to have separate phase shifters 62 and 64 in the carrier and peaking path that can apply a dynamic phase shift dependent on the envelope signal.

In yet another embodiment, the baseband can provide a separate analog envelope signal (or envelope derived/dependent signal). Further signal shaping (pre-distortion) can be used in order to achieve the desired dynamic linearization control signal. The embodiment of FIG. 6 provides:

Envelope tracking dynamic phase shift

Dedicated baseband dynamic phase shift

Internal dynamic phase shift controlled by a signal generated in the Doherty power amplifier, for example by sensing the saturation of the carrier power amplifier (when the peaking power amplifier needs to be activated).

Figure 7A:
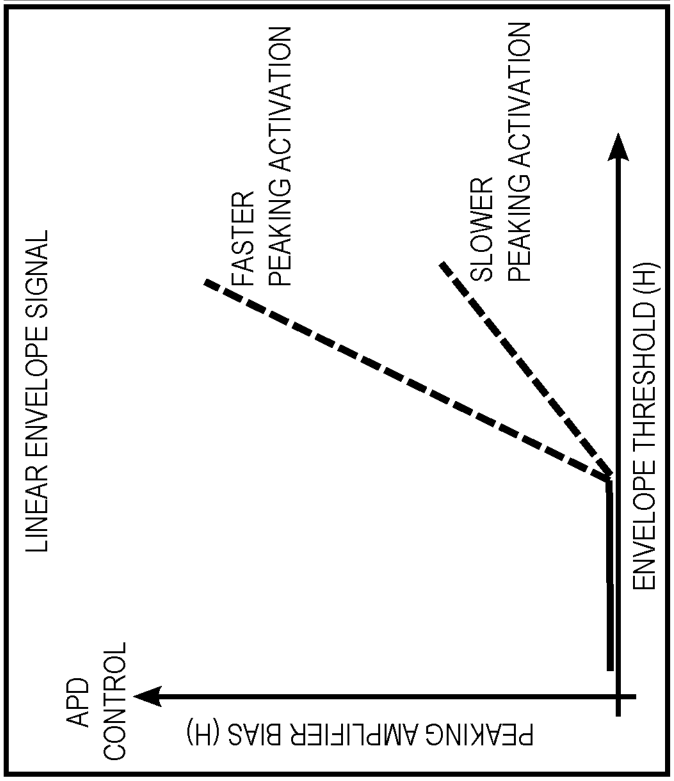
FIG. 7A is a graph depicting a linear analog signal for peaking power amplifier activation.
Figure 7B:
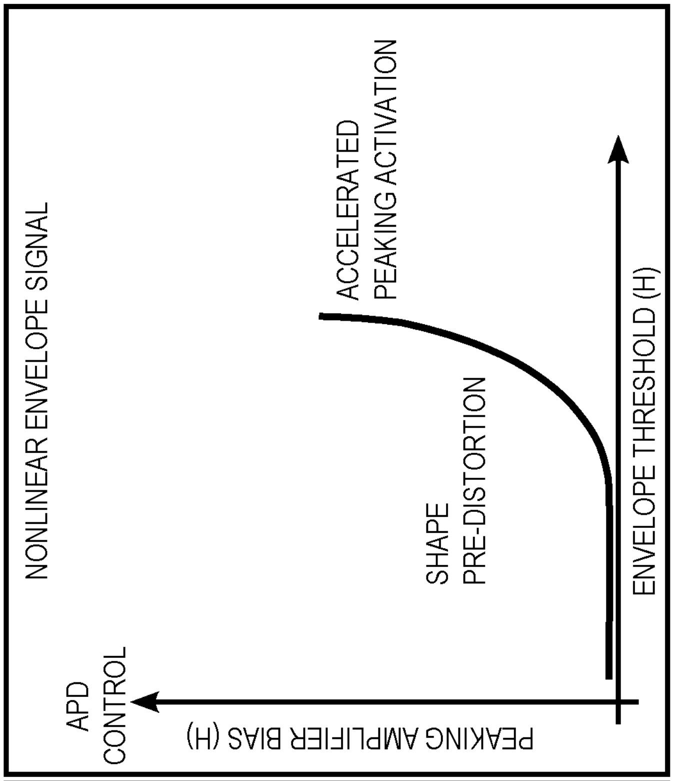
FIG. 7B is a graph of a non-linear analog signal for accelerated peaking power amplifier activation.

FIG. 7A is a graph depicting a linear analog signal for peaking power amplifier activation. A lower slope leads to slower activation, while a higher slope results in faster activation. FIG. 7B is a graph of a non-linear analog signal for accelerated peaking power amplifier activation.

Figure 8A:
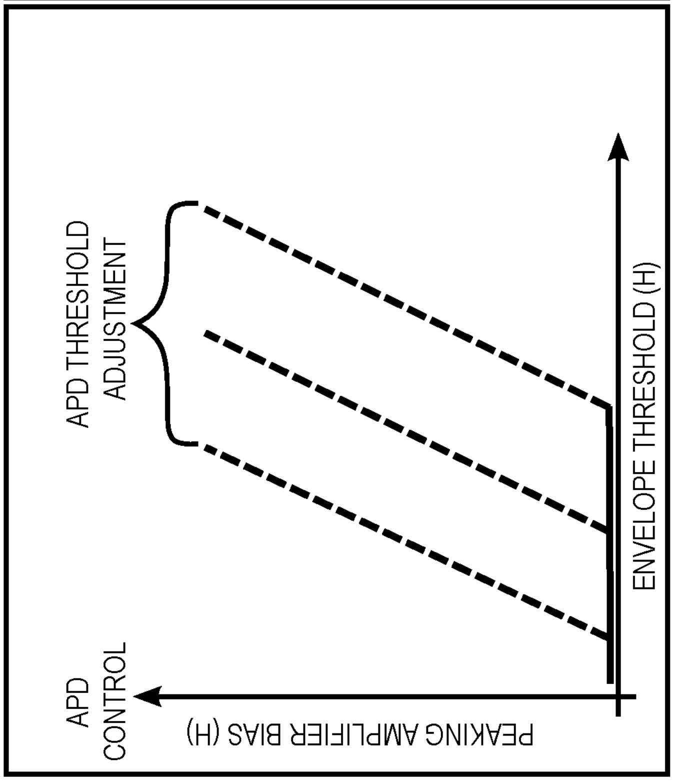
FIG. 8A is an example of peaking power amplifier activation alignment using analog pre-distortion threshold adjustment.
Figure 8B:
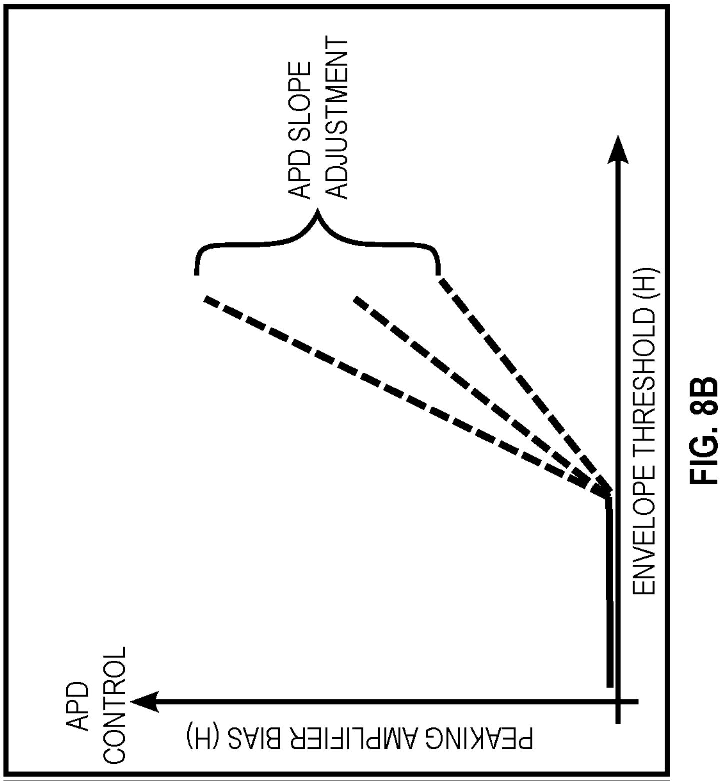
FIG. 8B is an example of peaking power amplifier activation alignment using analog pre-distortion slope adjustment.

FIG. 8A and FIG. 8B are examples of peaking power amplifier activation alignment using both APD threshold adjustment (FIG. 8A) and APD slope adjustment (FIG. 8B). Both alignments can be driven by a calibration circuit for Doherty power amplifier APD linearization.

Figure 9:
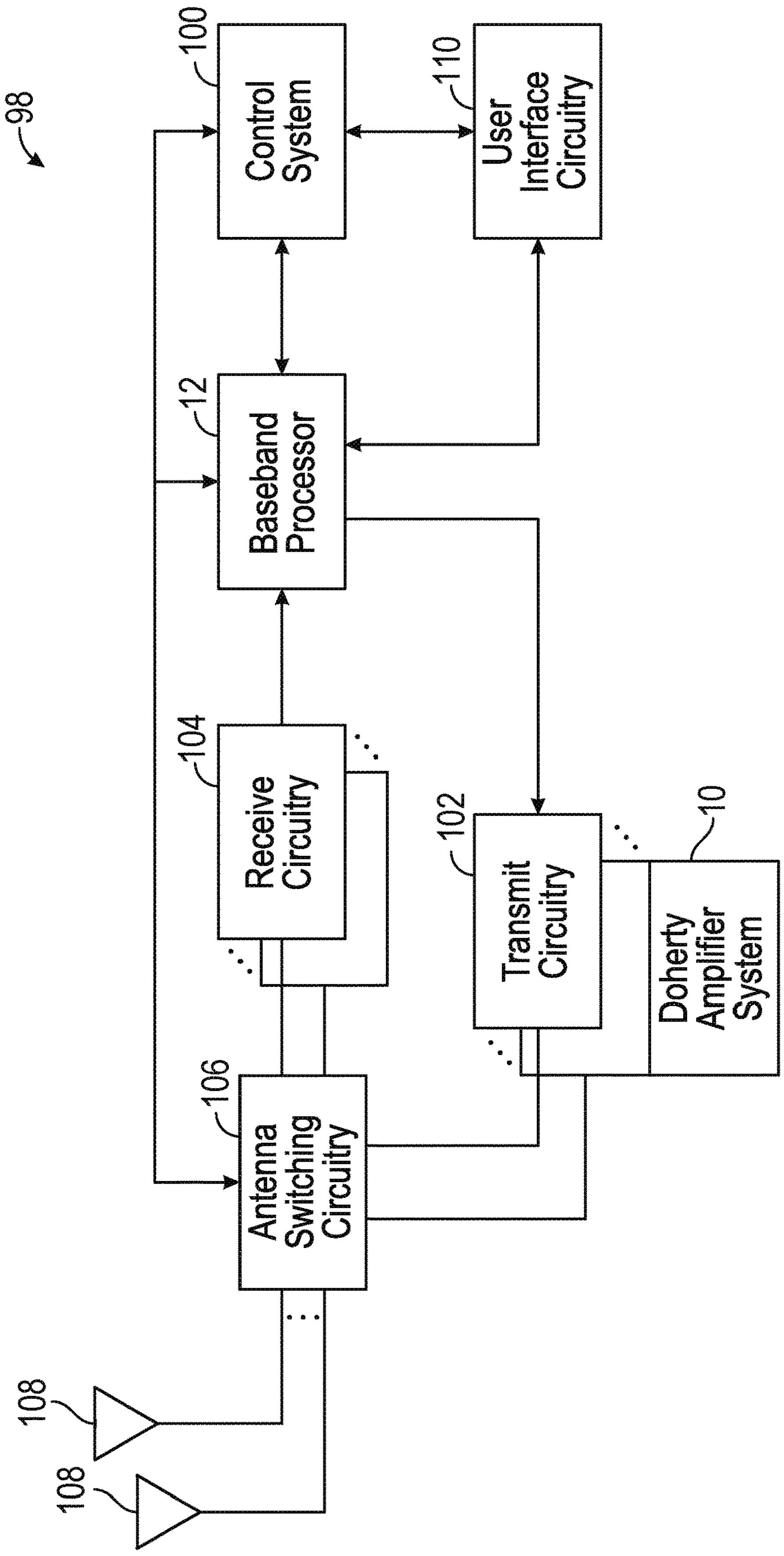
FIG. 9 is a schematic of a wireless communications device that incorporates the Doherty amplifier system of the present disclosure.

With reference to FIG. 9, the concepts described above may be implemented in various types of wireless communication devices or user elements 98, such as mobile terminals, smart watches, tablets, computers, navigation devices, access points, and the like that support wireless communications, such as cellular, wireless local area network (WLAN), Bluetooth, and near-field communications. The user elements 98 will generally include a control system 100, the baseband processor 12, transmit circuitry 102, receive circuitry 104, antenna switching circuitry 106, multiple antennas 108, and user interface circuitry 110. The receive circuitry 104 receives radio frequency signals via the antennas 108 and through the antenna switching circuitry 106 from one or more basestations. A low-noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams.

The baseband processor 12 processes the digitized received signal to extract the information or data bits conveyed in the received signal. This processing typically comprises demodulation, decoding, and error correction operations. The baseband processor 12 is generally implemented in one or more digital signal processors (DSPs) and application-specific integrated circuits (ASICs). For transmission, the baseband processor 12 receives digitized data, which may represent voice, data, or control information, from the control system 100, which it encodes for transmission. The encoded data is output to the transmit circuitry 102, where it is used by a modulator to modulate a carrier signal that is at a desired transmit frequency or frequencies. The Doherty power amplifier system 10 will amplify the modulated carrier signal to a level appropriate for transmission and deliver the modulated carrier signal to the antennas 108 through the antenna switching circuitry 106. The multiple antennas 108 and the replicated transmit circuitry 102 and receive circuitry 104 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A Doherty amplifier system comprising:
- a carrier amplifier having a carrier input and a carrier output;
- a peaking amplifier having a peaking input coupled to the carrier input and a peaking output coupled to the carrier output; and
- analog pre-distortion (APD) circuitry configured to linearize the carrier amplifier and linearize the peaking amplifier by compensating for base-to-collector capacitance (Cbc) loading of the carrier amplifier and the peaking amplifier during operation, wherein the APD circuitry is configured in response to detectors to adjust gain of a carrier amplification path that includes the carrier amplifier.

2. The Doherty amplifier system of claim 1 further comprising:
- an input impedance inverter coupled between the carrier input and the peaking input; and
- an output impedance inverter coupled between the carrier output and peaking output.

3. The Doherty amplifier system of claim 2 further comprising:
- a carrier driver input stage having a carrier driver output coupled to the carrier input; and
- a peaking driver input stage having a peaking driver output coupled to the peaking input.

4. The Doherty amplifier system of claim 3 wherein the carrier driver input stage and the peaking driver input stage are of the complementary metal oxide semiconductor (CMOS) type.

5. The Doherty amplifier system of claim 1 wherein the carrier amplifier and the peaking amplifier are of the bipolar type.

6. The Doherty amplifier system of claim 1 wherein the APD circuitry is configured in response to the detectors to adjust gain of a peaking amplification path that includes the peaking amplifier.

7. The Doherty amplifier system of claim 1 wherein the APD circuitry is configured in response to sensors to adjust gain of the carrier amplification path that includes the carrier amplifier and to adjust gain of a peaking amplification path that includes the peaking amplifier.

8. The Doherty amplifier system of claim 1 further comprising digital pre-distortion (DPD) circuitry configured to linearize the carrier amplifier and linearize the peaking amplifier by compensating for Cbc loading of the carrier amplifier and the peaking amplifier during operation.

9. The Doherty amplifier system of claim 8 wherein the APD circuitry and the DPD circuitry are configured to compensate substantially equally for Cbc loading of the carrier amplifier and the peaking amplifier.

10. The Doherty amplifier system of claim 8 wherein the APD circuitry is configured to provide greater than 50% of the compensation for Cbc loading of the carrier amplifier and the peaking amplifier than the DPD circuitry.

11. The Doherty amplifier system of claim 8 wherein the DPD circuitry is configured to provide greater than 50% of the compensation for Cbc loading of the carrier amplifier and the peaking amplifier than the APD circuitry.

12. The Doherty amplifier system of claim 1 further comprising:
- an in-phase/quadrature (I/Q) modulator configured to generate a digital RF signal and a distortion compensation signal;
- digital-to-analog converters configured to receive I and Q components of the digital RF signal that are combined into an analog RF signal that passes through signal paths of the carrier amplifier and the peaking amplifier for amplification; and
- a time alignment block that is configured to align the distortion compensation signal with the digital RF signal.

13. The Doherty amplifier system of claim 12 further comprising an envelope shaping block that is configured to digitally generate and shape an envelope of the distortion compensation signal that controls the APD circuitry.

14. The Doherty amplifier system of claim 13 further comprising bias circuitry that is configured to generate bias for the peaking amplifier in response to the distortion compensation signal.

15. The Doherty amplifier system of claim 13 wherein the envelope shaping block is configured to output the distortion compensation signal to an envelope tracking/average power tracking power management integrated circuit.

16. A method of operating a Doherty amplifier system comprising:
- providing a carrier amplifier having a carrier input and a carrier output;
- providing a peaking amplifier having a peaking input coupled to the carrier input and a peaking output coupled to the carrier output;
- providing analog pre-distortion (APD) circuitry; and
- linearizing the carrier amplifier by way of the APD circuitry compensating for base-to-collector capacitance (Cbc) loading of the carrier amplifier during operation wherein the APD circuitry is configured in response to detectors to adjust gain of a carrier amplification path that includes the carrier amplifier.

17. The method of operating the Doherty amplifier system of claim 16 further comprising linearizing the peaking amplifier by way of the APD circuitry compensating for Cbc loading of the peaking amplifier during operation.

18. The method of operating the Doherty amplifier system of claim 17 further comprising providing digital pre-distortion (DPD) circuitry configured to linearize the carrier amplifier and linearize the peaking amplifier by way of the DPD circuitry compensating for Cbc loading of the carrier amplifier and the peaking amplifier during operation.

19. The method of operating the Doherty amplifier system of claim 18 wherein the APD circuitry and the DPD circuitry compensate substantially equally for the Cbc loading of the carrier amplifier and the peaking amplifier.

20. The method of operating the Doherty amplifier system of claim 16 comprising:

providing a baseband processor that includes an in-phase/quadrature (I/Q) modulator and a time alignment block;

generating a digital RF signal and a distortion compensation signal using the I/Q modulator, wherein the digital RF signal is converted to an analog signal that is passed to a carrier signal path and a peaking signal path for amplification by the carrier amplifier and peaking amplifier, respectively; and aligning the distortion compensation signal with the digital RF signal using the time alignment block.

21. The method of operating the Doherty amplifier system of claim 20 further comprising:

providing an envelope shaping block;

digitally generating and shaping an envelope of the distortion compensation signal with the envelope shaping block;

controlling the APD circuitry using the shaped envelope of the distortion compensation signal.

22. The method of operating the Doherty amplifier system of claim 21 further comprising:

providing bias circuitry for the peaking amplifier;

generating bias for the peaking amplifier in response to the distortion compensation signal using the bias circuitry.

23. The method of operating the Doherty amplifier system of claim 21 further comprising:

configuring the envelope shaping block to output the distortion compensation signal;

sending the output compensation signal to an envelope tracking/average power tracking power management integrated circuit.

24. A wireless communication device comprising:

a baseband processor;

transmit circuitry configured to receive encoded data from the baseband processor and modulate a carrier signal with the encoded data, wherein the transmit circuitry comprises:

a carrier amplifier having a carrier input configured to receive the carrier signal and a carrier output;

a peaking amplifier having a peaking input coupled to the carrier input and a peaking output coupled to the carrier output; and APD circuitry configured to linearize the carrier amplifier and linearize the peaking amplifier by compensating for base-to-collector capacitance (Cbc) loading of the carrier amplifier and the peaking amplifier during operation;

wherein the APD circuitry is configured in response to detectors to adjust gain of a peaking amplification path that includes the peaking amplifier; and at least one antenna coupled to the transmit circuitry to transmit the carrier signal.

25. The wireless communication device of claim 24 wherein the APD circuitry is configured in response to the detectors to adjust gain of a carrier amplification path that includes the carrier amplifier.

26. The wireless communication device of claim 24 wherein the APD circuitry is configured in response to sensors to adjust gain of a carrier amplification path that includes the carrier amplifier and to adjust gain of the peaking amplification path that includes the peaking amplifier.

27. The wireless communication device of claim 24 further comprising digital pre-distortion (DPD) circuitry configured to linearize the carrier amplifier and linearize the peaking amplifier by compensating for Cbc loading of the carrier amplifier and the peaking amplifier during operation.

28. The wireless communication device of claim 27 wherein the APD circuitry and the DPD circuitry are configured to compensate substantially equally for Cbc loading of the carrier amplifier and the peaking amplifier.

29. The wireless communication device of claim 27 wherein the APD circuitry is configured to provide greater than 50% of the compensation for Cbc loading of the carrier amplifier and the peaking amplifier than the DPD circuitry.

30. The wireless communication device of claim 27 wherein the DPD circuitry is configured to provide greater than 50% of the compensation for Cbc loading of the carrier amplifier and the peaking amplifier than the APD circuitry.

31. The wireless communication device of claim 27 wherein the baseband processor comprises:

an in-phase/quadrature (I/Q) modulator configured to generate a digital RF signal and a distortion compensation signal;

digital-to-analog converters configured to receive I and Q components of the digital RF signal that are combined into an analog RF signal that passes through signal paths of the carrier amplifier and the peaking amplifier for amplification; and a time alignment block that is configured to align the distortion compensation signal with the digital RF signal.

32. The wireless communication device of claim 31 further comprising an envelope shaping block that is configured to digitally generate and shape an envelope of the distortion compensation signal that controls the APD circuitry.

33. The wireless communication device of claim 32 further comprising bias circuitry that is configured to generate bias for the peaking amplifier in response to the distortion compensation signal.

34. The wireless communication device of claim 32 wherein the envelope shaping block is configured to output the distortion compensation signal to an envelope tracking/average power tracking power management integrated circuit.

* * * * *